(12) United States Patent
Kim

(10) Patent No.: US 6,995,074 B2
(45) Date of Patent: Feb. 7, 2006

(54) METHOD FOR MANUFACTURING A SEMICONDUCTOR WAFER

(75) Inventor: Deok-Yong Kim, Gunpo-si (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 18 days.

(21) Appl. No.: 10/393,015

(22) Filed: Mar. 21, 2003

(65) Prior Publication Data

US 2004/0026788 A1    Feb. 12, 2004

(30) Foreign Application Priority Data

Aug. 9, 2002    (KR)    ................................ 2002-47251

(51) Int. Cl.
*H01L 21/76*    (2006.01)
(52) U.S. Cl. ...................... 438/427; 438/424; 438/637; 438/638
(58) Field of Classification Search ................ 257/774, 257/775; 438/637, 638, 639, 640, 668, 781, 438/713, 424, 427
See application file for complete search history.

(56) References Cited

U.S. PATENT DOCUMENTS

| | | | | |
|---|---|---|---|---|
| 4,579,812 A | * | 4/1986 | Bower | ........................ 430/313 |
| 5,022,958 A | * | 6/1991 | Favreau et al. | ............. 438/297 |
| 5,063,175 A | * | 11/1991 | Broadbent | .................. 438/626 |
| 5,298,463 A | * | 3/1994 | Sandhu et al. | .............. 438/620 |
| 6,187,671 B1 | * | 2/2001 | Irinoda | ........................ 438/639 |
| 6,239,038 B1 | * | 5/2001 | Wen | ............................ 438/745 |
| 6,245,659 B1 | * | 6/2001 | Ushiyama | .................... 438/620 |
| 6,268,278 B1 | * | 7/2001 | Eimori et al. | ............... 438/624 |
| 6,432,816 B2 | * | 8/2002 | Kim et al. | .................... 438/637 |
| 6,465,310 B2 | * | 10/2002 | Lee et al. | .................... 438/299 |
| 6,770,555 B2 | * | 8/2004 | Yamazaki | .................... 438/620 |
| 6,864,152 B1 | * | 3/2005 | Mirbedini et al. | .......... 438/427 |

FOREIGN PATENT DOCUMENTS

KR    2000-4408    1/2000

OTHER PUBLICATIONS

Korean Patent No. 2000-67104 (English translation of Abstract only).
Korean Office Action dated 11/24/2004.

* cited by examiner

*Primary Examiner*—Jerome Jackson
*Assistant Examiner*—Edgardo Ortiz
(74) *Attorney, Agent, or Firm*—Harness, Dickey & Pierce

(57) ABSTRACT

A method for forming a semiconductor wafer such as a standard semiconductor wafer used in a surface analysis system. Openings may be formed by partially etching a semiconductor substrate, and an insulation film may be formed on the openings. Contact holes may be formed to expose portions of the semiconductor substrate and the insulation film in the openings. The contact holes may be inspected by the surface analysis system, and the reliability of data obtained from the surface analysis system may be more precisely discriminated.

37 Claims, 15 Drawing Sheets

METHOD FOR MANUFACTURING A SEMICONDUCTOR WAFER

CROSS-REFERENCE TO RELATED CASES

This U.S. nonprovisional patent application claims priority under 35 U.S.C. § 119 to Korean Patent Application 2002-0047251, filed on Aug. 9, 2002, the entire contents which are hereby incorporated by reference.

BACKGROUND OF THE INVENTION

1. Field of the Invention

The present invention relates to a method for manufacturing a standard wafer.

2. Description of the Related Art

Today, highly integrated semiconductor devices are necessary to keep up with the rapidly developing information age. As a result, dimensions of electrical wirings in semiconductor devices are now quite small, and due to miniaturization, these semiconductor devices typically have a multi-layered structure. To electrically connect the wirings in such a multi-layered structure, contacts are formed in the semiconductor device.

As semiconductor devices have become highly integrated, the size of a contact hole used for these connections has substantially decreased, while the aspect ratio of the contact hole has greatly increased. Thus, processes for forming the contact hole have become more difficult and complex, so that failures, such as the formation of a non-opened contact hole, may frequently occur.

Generally, a non-opened contact hole is located by checking the oxide film remaining in the contact hole. A system for inspecting non-opened contact holes should have sufficient resolution in order to identify the inside of a contact hole that is of a minute size. An inspection system, however, may not be able to precisely check the non-opened contact hole, due to its resolution.

Hence, an in-line scanning electron microscope (SEM) may be typically employed for monitoring a critical dimension (CD) of the contact hole, and thus for inspecting non-opened contact holes. However, the process of using a SEM to inspect non-opened contact holes is often time-consuming, thus only several contact holes in a semiconductor substrate are selected to inspect for non-opened contact holes thereon. Accordingly, a non-opened contact hole may not be identified, e.g., it may be skipped, particularly when non-opened contact holes are locally formed in a certain portion of the semiconductor substrate that is not selected for inspection.

Recently, a method for utilizing a difference between emission intensities of secondary electrons caused by electron beams of the SEM has been developed in order to discriminate non-opened contact holes. This method may be implemented by a system known as a surface analysis system. When the electron beams are applied in a normal contact hole ("opened contact hole") that is electrically connected to an underlying conductive material, the electrons of the electron beams pass into the conductive material. On the other hand, electrons of the electron beams accumulate along the surface of a non-opened contact hole when the electron beams are applied thereto. Thus, the beams cannot enter the underlying conductive material.

Additionally, an electric potential difference is generated between opened and the non-opened contact holes. The electric potential difference may cause differences in the amount of secondary electrons and energy distribution, as between the opened and non-opened contact holes. As a result, a brightness difference between the opened and the non-opened contact holes may appear, thus enabling the surface analysis system to identify a non-opened contact hole.

However, an inspector may not be able to authenticate the data obtained from the surface analysis system, in cases where the non-opened or opened contact holes are checked utilizing the difference between emission intensities of the secondary electrons, as caused by the electron beams of the SEM. The reliability of the inspection data obtained from the surface analysis system may be discriminated by identifying whether or not the inspection data can substantially capture a "real" (actual) failure, and by identifying whether or not the same inspection data can be obtained when an identical object is repeatedly inspected by the surface analysis system. The occurrence of the non-opened contact hole can be determined with precision only if the data generated from the surface analysis system is proven to be reliable and accurate.

SUMMARY OF THE INVENTION

In an exemplary embodiment, the present invention provides a method for manufacturing a semiconductor wafer, such as a standard semiconductor wafer or test wafer that may be used for a surface analysis system, in order to ensure reliability of data provided from the surface analysis system.

In an exemplary embodiment, the present invention is directed to a method of forming a semiconductor wafer, which may include partially etching a semiconductor substrate to form openings therein. An insulation film may be formed over the semiconductor substrate and openings, and contact holes may be formed that expose portions of the semiconductor substrate and portions of the insulation film within the openings. The depth of the openings may vary across the semiconductor substrate.

According to another exemplary embodiment, the present invention is directed to a method of forming a standard semiconductor wafer, where, after openings are formed by partially etching a semiconductor substrate, an insulation film may be formed to cover the openings. Contact holes, to be inspected by the surface analysis system, for example, may be formed to expose portions of the semiconductor substrate and the insulation film in the openings.

According to a further exemplary embodiment, the present invention is directed to a method of forming a standard semiconductor wafer used in the surface analysis system, where, after first insulation film patterns are formed on a semiconductor substrate, a second insulation film may be formed on the semiconductor substrate and first insulation film patterns. Contact holes may be formed to expose portions of the semiconductor substrate and the first insulation film patterns by partially etching the second insulation film on the semiconductor substrate and first insulation film patterns.

According to another exemplary embodiment, the present invention is directed to a method of forming the standard semiconductor wafer used for the surface analysis system, where a semiconductor substrate may be divided into a first to n-th (wherein n denotes a positive integer) regions, and an insulation film may be formed on the semiconductor substrate. The insulation film may include portions having different thicknesses in different regions of the semiconductor substrate. Contact holes may be formed to expose portions of the semiconductor substrate and the insulation film, by partially etching the insulation film in each region of the semiconductor substrate, for example.

According to another exemplary embodiment, the present invention is directed to a method of forming a standard semiconductor wafer, where first patterns may be formed on a semiconductor substrate, and spacers may then be formed on sidewalls of the first patterns. An interlayer dielectric film may be formed to cover the first patterns and spacers, and contact holes to be inspected by the surface analysis system may be formed. The contact holes may include non-opened contact holes that are formed to expose portions of films formed on the semiconductor substrate by partially etching the interlayer dielectric film between the first patterns.

According to a further exemplary embodiment, the present invention is directed to a method of forming a semiconductor wafer, where gate structures having sidewalls may be formed on a semiconductor substrate and a dielectric film may be formed to cover the gate structures and sidewalls. Contact holes having varied depths may then be formed by partially etching the dielectric film, for example. The semiconductor substrate may have a plurality of regions, with portions of the dielectric film within the contact holes having differing thicknesses within different regions of the semiconductor substrate.

According to the various exemplary embodiments described hereafter, an insulation film may partially, or entirely, remain in the contact holes for inspection of a standard semiconductor wafer. Namely, the contact holes may be partially or entirely opened. Therefore, by using a standard semiconductor wafer, an inspector may identify whether the surface analysis system accurately distinguishes opened contact holes from non-opened contact holes by using electron beams with improved ease and accuracy, as compared to currently available techniques.

BRIEF DESCRIPTION OF THE DRAWINGS

Exemplary embodiments of the present invention will become more fully understood from the detailed description given herein below and the accompanying drawings; wherein like elements are represented by like reference numbers which are given by way of illustrative only, and thus are not limitative of exemplary embodiments of the present invention and wherein.

DETAILED DESCRIPTION OF EXEMPLARY EMBODIMENTS

Figure 1A:
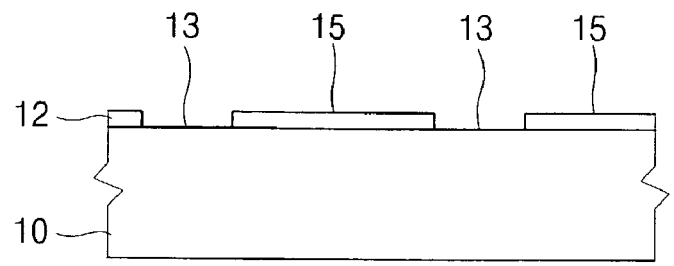
FIGS. 1A to 1E are cross-sectional views illustrating a method for manufacturing a standard wafer used for a surface analysis system according to an exemplary embodiment of the present invention.

The present invention and exemplary embodiments thereof are described more fully with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the drawings, the thickness of layers and regions are exaggerated for clarity. When a layer is referred to as being "on" another layer or substrate, the layer may be directly on the other layer or substrate, or intervening layers may also be present.

FIGS. 1A to 1E are cross-sectional views illustrating a method for manufacturing a standard semiconductor wafer used for a surface analysis system according to an exemplary embodiment of the present invention. Referring to FIG. 1A, a photoresist film may be provided so as to coat a surface of a semiconductor wafer 10. The photoresist film may be selectively exposed to form a first photoresist pattern 12 having opened portions 13 for exposing semiconductor wafer 10. In this case, intervals 15 between opened portions 13 formed on the semiconductor wafer 10 may be arranged, such that at least one additional opened portion 13 having a width equal to, or substantially equal to, previously formed opened portions 13, for example, may be formed.

Figure 1B:
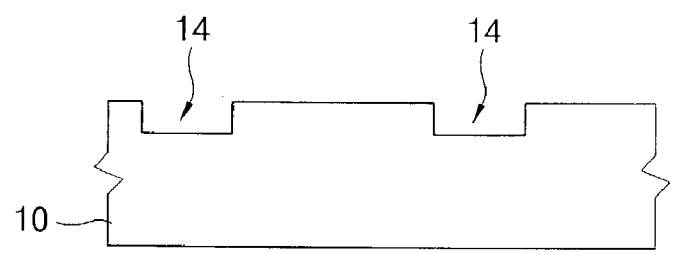

Referring to FIG. 1B, openings 14 may be formed on the semiconductor wafer 10 by partially etching semiconductor wafer 10 using the first photoresist pattern 12 as an etching mask. The openings 14 may be configured to have a line shape or a hole shape, for example. The first photoresist pattern 12 may be removed from the semiconductor wafer 10, by an ashing process, for example.

Figure 1C:
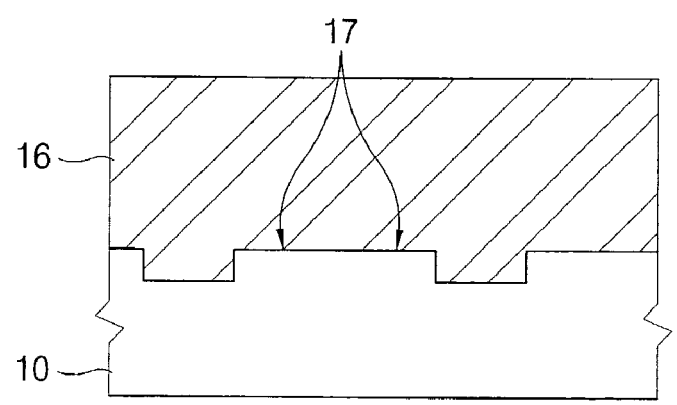

Referring to FIG. 1C, an insulation film 16 having an upper face may be formed on semiconductor wafer 10 and on openings 14 formed thereon. The insulation film may have a substantially planar upper face. The insulation film 16 may include a silicon oxide film, a silicon nitride film or a composite film of the silicon oxide film and silicon nitride film, for example. When the insulation film 16 includes the composite film, each film may be formed to have a substantially planar upper face. A thickness of the insulation film 16 formed within openings 14 may be thicker than portions of the insulation film 16 that are positioned on semiconductor wafer 10 next to opening 14, as indicated generally at 17.

The insulation film 16 may be formed through various forming techniques. For example, after insulation material is deposited on semiconductor wafer 10 to cover openings 14, the insulation material may be partially removed, so that the insulation material remains only in openings 14. The insulation material can be removed through a chemical-mechanical polishing (CMP) process or a dry etching process, for example, as is known. The insulation material may include a silicon oxide film or a silicon nitride film, for example. Using the above-described process, a first insulation film may be formed in openings 14. Subsequently, a second insulation film may be formed on semiconductor wafer 10 and on the first insulation film. Thus, insulation film 16 can be formed as a composite film having different materials.

In another forming technique, after an insulation film is deposited to cover openings 14, the insulation film may be planarized by a process such as CMP, without exposing the surface of semiconductor wafer 10. Planarizing smoothes or levels the topography of the insulation film in order to properly pattern subsequent films or layers that may be formed thereon. Though insulation film 16 does not include a composite film, the insulation film may be more easily formed, since it is of a simpler, single film structure.

Figure 1D:
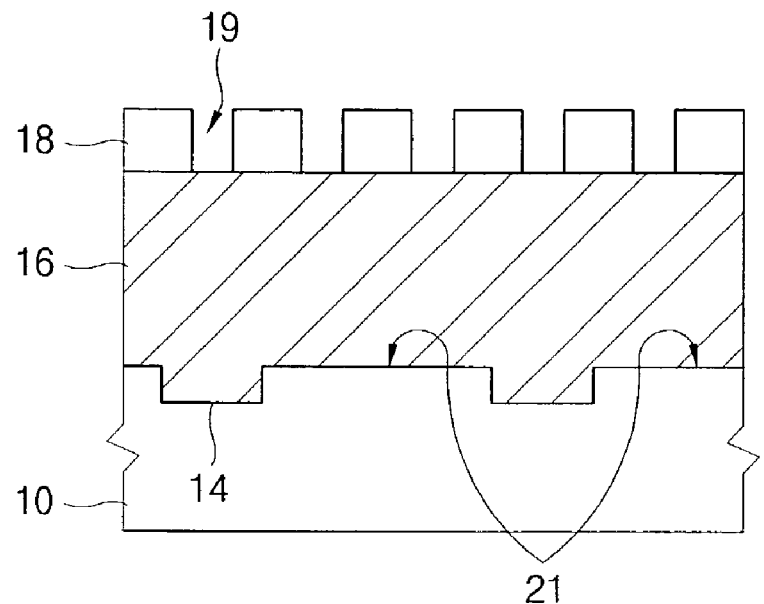

Referring to FIG. 1D, after a photoresist film is coated on the surface of insulation film 16, a second photoresist pattern 18 may be formed on insulation film 16 in order to form contact holes (the contact holes that may be inspected by a surface analysis system, for example). Some contact holes could be arranged to expose insulation film 16 formed in openings 14, and other contact holes could be arranged to expose an upper face of semiconductor wafer 10. The second photoresist pattern 18 may include opened portions 19 having regular widths over openings 14 and over portions semiconductor wafer 10 between the openings 14, indicated generally at 21.

Figure 1E:
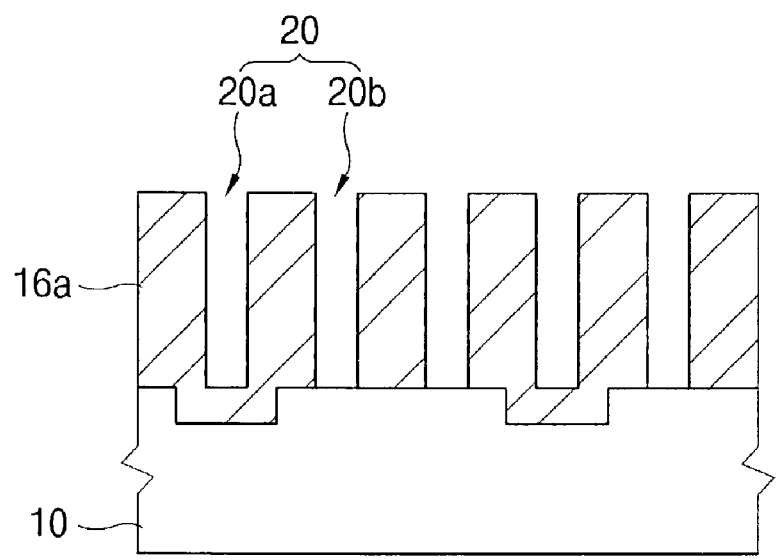

Referring to FIG. 1E, contact holes 20 (e.g., for inspection) may be formed through the insulation film 16a by etching the insulation film 16a using the second photoresist pattern 18 as an etching mask. The insulation film 16a may be partially etched until upper portions of semiconductor wafer 10 between openings 14 are exposed. When the insulation film 16a is partially etched to expose an upper portion of semiconductor wafer 10, for example, portions of the insulation film 16a remain in openings 14. Thus, some contact holes 20 may expose the portions of the insulation film 16a remaining in the openings 14, while other contact holes may expose upper portions of semiconductor wafer 10. Contact holes 20a exposing portions of the insulation film 16a may be referred to as "non-opened contact holes 20a", and contact holes exposing the semiconductor wafer 10 may be referred to as "opened contact holes 20b". Opened contact holes 20b and non-opened contact holes 20a may be regularly and alternately disposed, so that an inspector may more easily and accurately identify positions containing the non-opened contact holes 20a.

FIG. 1E represents a standard semiconductor wafer for use in a surface analysis system, in accordance with an exemplary embodiment. The standard semiconductor wafer may include opened contact holes 20b and non-opened contact holes 20a that may be alternatively disposed, as described above. The number of the opened contact holes 20b on the semiconductor wafer 10 may or may not equal the number of non-opened contact holes 20a. Also, a thickness of the portions of the insulation film 16a within openings 14, exposed through the non-opened contact holes 20a, may be equal to the depth of the openings 14. Thus, an inspector may identify the positions, and number, of non-opened contact holes 20a. Further, the inspector may measure the thickness of any insulation film 16a remaining in openings 14.

Accordingly, a standard semiconductor water formed in accordance with the above exemplary embodiment may enable the inspector to more clearly recognize the reliability of data obtained from a surface analysis system that inspects contact holes 20, using electron beams. For example, the standard semiconductor wafer may be introduced into a surface analysis system inspecting contact holes 20, so that the number of non-opened contact holes 20a are measured, and so that images of non-opened contact holes 20a are more easily identified. The number of non-opened contact holes 20a obtained by the surface analysis system may be compared to the number of non-opened contact holes designed for the standard semiconductor wafer, in order to identify any difference between the two counts. Also, positions of non-opened contact holes 20a, as measured by the surface analysis system, may be compared to positions of non-opened contact holes as designed for the standard semiconductor wafer, thereby identifying any difference between the measured and designed positions of the non-opened contact holes. Therefore, an inspector may identify reliability of data concerning the number and positions of the non-opened contact holes 20a, as measured by the surface analysis system, with greater certainty and precision.

Using the above-described exemplary embodiments for forming the standard semiconductor wafer, a plurality of standard semiconductor wafers can be manufactured, and each of these wafers may include openings having different depths. When standard semiconductor wafers with openings having different depths are used, the thickness of insulation films remaining (e.g., excess film) in the openings (exposed through the non-opened contact holes) may be split between standard semiconductor wafers. Therefore, an inspector can identify whether a surface analysis system inspecting these wafers (e.g., wafers with varied-depth openings) discriminates the non-opened contact holes from opened contact holes based on the thickness of insulation films remaining in the openings. Also, the standard semiconductor wafers of the above-described exemplary embodiment may be manufactured by simple process.

The above exemplary embodiment(s) may be used to manufacture several standard semiconductor wafers using insulation films having different thicknesses. Thus, an inspector may identify that the surface analysis system can inspect contact holes with greater accuracy, even when aspect ratios of the contact holes are varied. Furthermore, the above exemplary embodiment may be used to manufacture a plurality of standard semiconductor wafers having insulation films, exposed through the non-opened contact holes, and including different materials.

FIGS. 2A to 2F are cross-sectional views illustrating a method for manufacturing a standard semiconductor wafer used for surface analysis system according to another exemplary embodiment of the present invention. The method for manufacturing the standard semiconductor wafer is substantially identical to that of the previous embodiments, except that the openings formed by etching a semiconductor wafer have differing depths, in different regions of the semiconductor wafer.

Figure 2A:
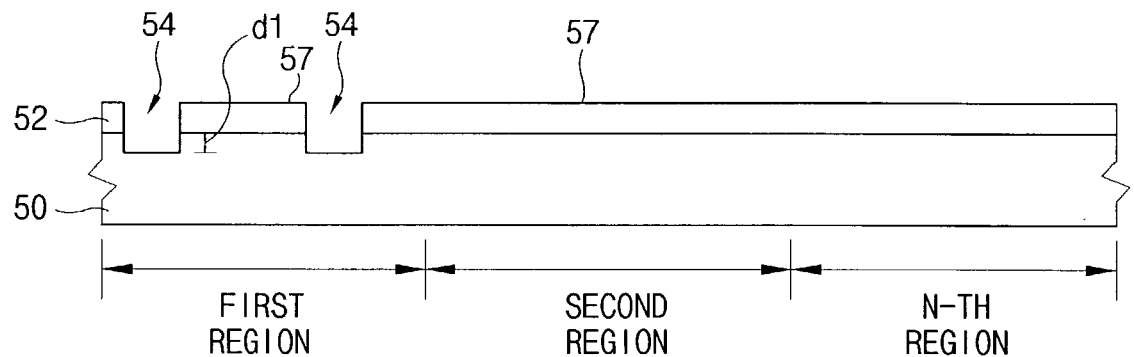
FIGS. 2A to 2F are cross-sectional views illustrating a method for manufacturing a standard semiconductor wafer used for a surface analysis system according to another exemplary embodiment of the present invention.

Referring to FIG. 2A, after a semiconductor wafer 50 is divided into a first region, a second region, etc. and an n-th region, a photoresist film may be applied over the surface of semiconductor wafer 50, including the first to n-th regions. The photoresist film may be selectively and partially exposed to form a first photoresist pattern 52 in a first region of the semiconductor wafer 50. The first photoresist pattern 52 may include opened portions separated by intervals 57, thereby forming one or more first openings 54 in the first region of semiconductor wafer 50. The first region of the semiconductor wafer 50 may then be partially etched to a first depth d1, using first photoresist pattern 52 as an etching mask, for example, to form first openings 54 in the first region. Subsequently, the first photoresist pattern 52 may be removed by an ashing process.

Figure 2B:
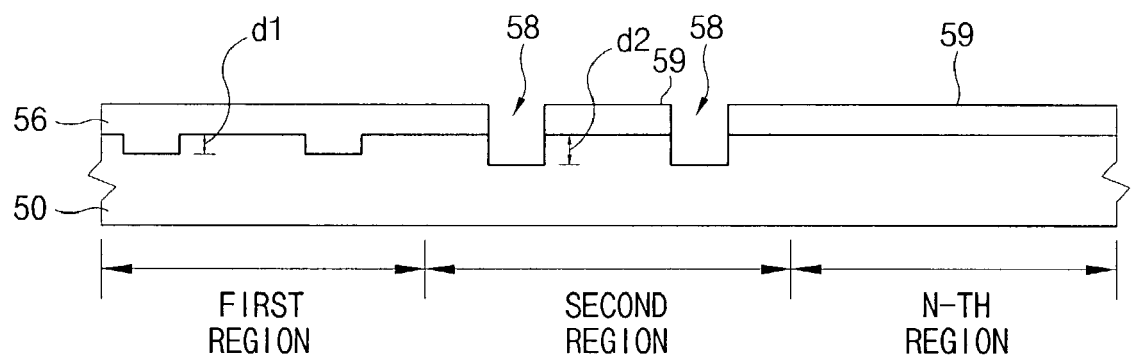

Referring to FIG. 2B, a photoresist film may be coated on the semiconductor wafer 50 to cover first openings 54. A portion of the photoresist film may be selectively exposed to form a second photoresist pattern 56 in a second region of semiconductor wafer 50. In this case, the second photoresist pattern 56 may include opened portions separated by intervals 59 in order to form one or more second openings 58 in the second region. The second region of the semiconductor wafer 50 may be partially etched to a second depth d2 using the second photoresist pattern 56 as an etching mask, so that the second openings 58 are formed in the second region. Subsequently, the second photoresist pattern 56 may be removed by an ashing process. The above-described processes with reference to FIGS. 2A and 2B may be repeated such that third to (n-1)th openings are formed in third to n-th regions of the semiconductor wafer 50, for example.

Figure 2C:
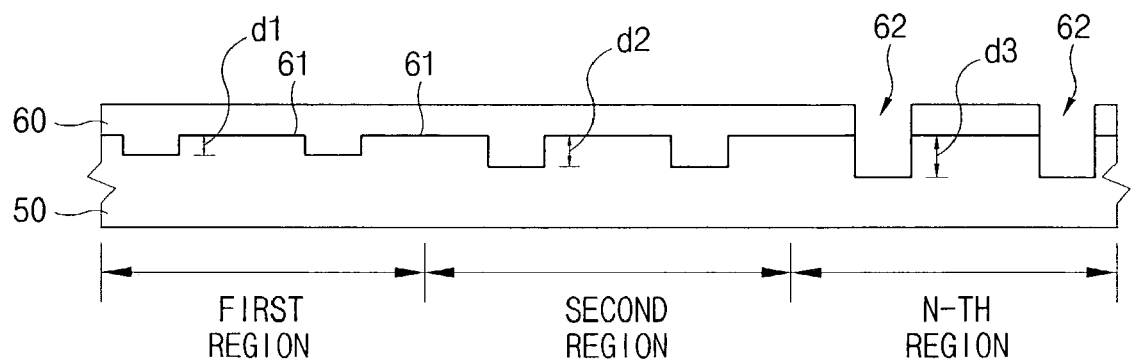

Referring to FIG. 2C, a photoresist film may be coated on the semiconductor wafer 50 to cover the first to the (n-1)th openings formed in the first to the (n-1)th regions. The photoresist film may be selectively exposed to form an n-th photoresist pattern 60 in an n-th region of the semiconductor wafer 50. The n-th photoresist pattern 60 may include opened portions separated by intervals 61 in order to form one or more n-th openings in the n-th region of the semiconductor wafer 50.

The n-th region of the semiconductor wafer 50 may be partially etched to an n-th depth d3 using the n-th photoresist pattern 60 as an etching mask, so that the n-th openings 62 are formed in the n-th region. Subsequently, the n-th photoresist pattern 60 may be removed by the aforementioned ashing process. Therefore, first to the n-th openings 54, 58 and 62 having respective first to n-th depths d1, d2 and d3 may be formed on semiconductor water 50, as shown in FIG. 2C.

Figure 2D:
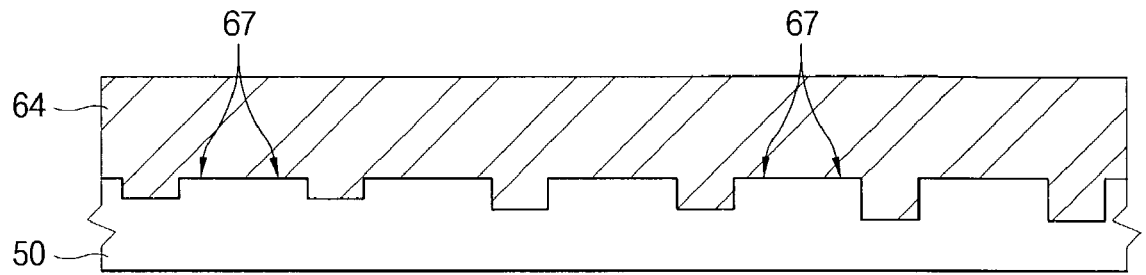

Referring to FIG. 2D, an insulation film 64 having an upper face may be formed on the semiconductor wafer 50 to cover the first to the n-th openings 54, 58 and 62. The upper face may be substantially planar. The insulation film 64 may include a silicon oxide film, a silicon nitride film or a composite film of the silicon oxide film and the silicon nitride film. When the insulation film 64 includes the composite film, each film may be formed to have a substantially planar upper face. A thickness of the insulation film 64 formed within the first to n-th openings 54, 58 and 62 may be thicker than portions of the insulation film 64 that are positioned on the semiconductor wafer 50 by the depths of the first to n-th opening 54, 58 and 62, as indicated generally at 67 in FIG. 2D. The method for forming the insulation film 64 with the above-mentioned structure may be similar to that described in previous exemplary embodiments.

Figure 2E:
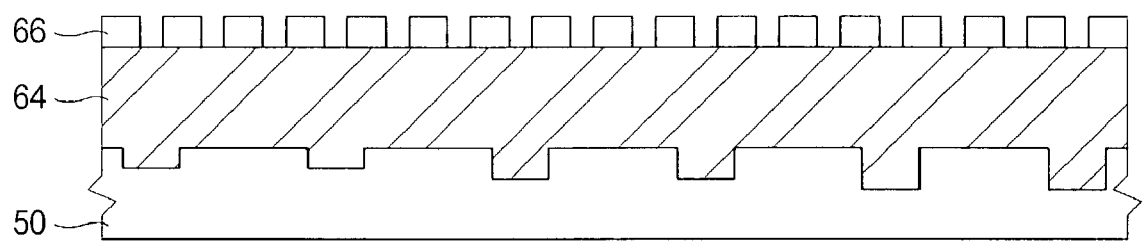

Referring to FIG. 2E, a photoresist film may be coated on the insulation film 64, and a photoresist pattern 66 may then be formed on the insulation film 64 in order to form contact holes (which are to be inspected by the surface analysis system). In this case, some contact holes may expose the insulation film 64 formed in the first to n-th openings 54, 58 and 62, and other contact holes may expose an upper face of semiconductor wafer 50. The photoresist pattern 66 may include opened portions having regular widths over the first to n-th openings 54, 58 and 62, and over portions of the semiconductor wafer 50 between the first to n-th openings 54, 58 and 62.

Figure 2F:
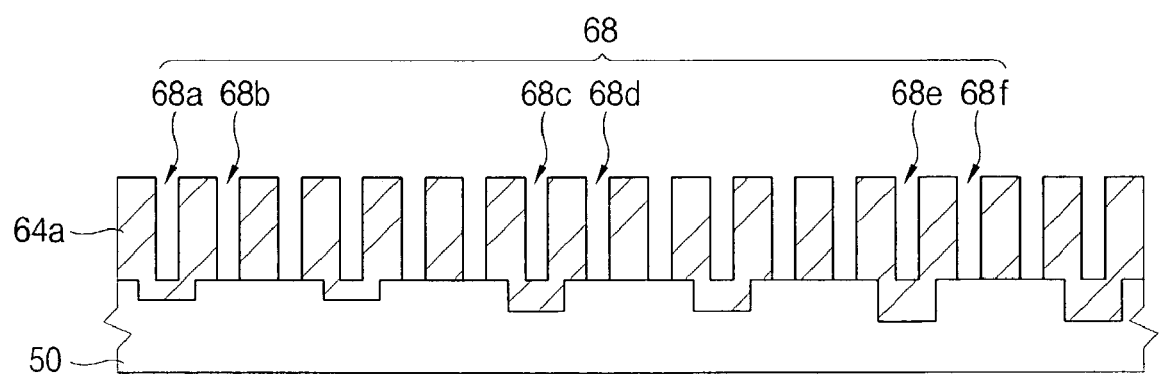

Referring to FIG. 2F, contact holes 68 may be formed through insulation film 64a by etching insulation film 64a using the photoresist pattern 66 as an etching mask, for example. The insulation film 64a may be partially etched until the upper portions of semiconductor wafer 50, between the first to the n-th openings 54, 58 and 62, are exposed. When the insulation film 64a is partially etched to expose the upper face of the semiconductor wafer 50, portions of the insulation film 64a may remain in the first to the n-th openings 54, 58 and 62. Thus, some contact holes 68a, 68c and 68e may expose portions of the insulation film 64a that remain in the first to n-th openings 54, 58 and 62, while other contact holes 68b, 68d, and 68f may expose the upper portions of the semiconductor wafer 50 as shown in FIG. 2F. Additionally, portions of the insulation film 64a remaining in the first to n-th regions may have different thicknesses in the first to n-th regions of the semiconductor wafer 50.

Hereinafter, contact holes for 68a, 68c, and 68e, exposing portions of the insulation film 64a, may be referred to as "non-opened contact holes", and contact holes 68b, 68d, and 68f, exposing the semiconductor wafer 50, may be referred to as "opened contact holes".

FIG. 2F may represent a standard semiconductor wafer formed by the method in accordance with the above exemplary embodiment. The standard semiconductor wafer may include the opened contact holes 68b, 68d, and 68f and the non-opened contact holes 68a, 68c, and 68e, alternatively disposed, for example. As discussed previously, the surface analysis system inspects the standard semiconductor wafer using electron beams. In the standard semiconductor wafer of an exemplary embodiment, portions of the insulation film 64a exposed through the non-opened contact holes 68a, 68c, and 68e have differing thicknesses in the first to the n-th regions. Using a single standard semiconductor wafer, an inspector can identify, with greater accuracy and precision, that the surface analysis system distinguishes the non-opened contact holes 68a, 68c, and 68e formed on the standard semiconductor wafer based on the thickness of the insulation film 64a remaining in the first to n-th openings 54, 58 and 62. Also, costs may be advantageously reduced, since only one standard semiconductor wafer is necessary for use by the surface analysis system, e.g., the use of several standard semiconductor wafers (as currently required), in which the thickness of insulation films exposed through contact holes is spilt; is no longer required.

FIGS. 3A to 3E are cross-sectional views illustrating a method for manufacturing a standard semiconductor wafer used for a surface analysis system according to another exemplary embodiment of the present invention.

Figure 3A:
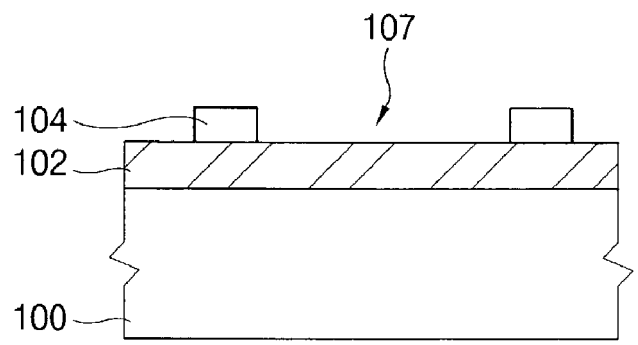
FIGS. 3A to 3E are cross-sectional views illustrating a method for manufacturing a standard semiconductor wafer used for a surface analysis system according to a further exemplary embodiment of the present invention.

Referring to FIG. 3A, an insulation film 102 may be formed on a semiconductor wafer 100 so as to have a uniform, or substantially uniform thickness. The insulation film 102 can include a silicon oxide film, a silicon nitride film or a composite film of the silicon oxide-film and a silicon nitride film, for example.

After a photoresist film is coated on the insulation film 102, the photoresist film may be masked and exposed so that first photoresist patterns 104 may be formed. In this case, an interval between first photoresist patterns 104 may be maintained such that at least one first insulation film pattern is formed between the first photoresist patterns 104.

Figure 3B:
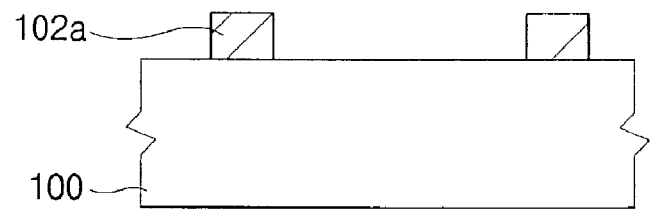

Referring to FIG. 3B, the first insulation film 102 may be etched, using the first photoresist patterns 104 as an etching mask, to form first insulation film patterns 102a on the semiconductor wafer 100. The first photoresist patterns 104 may be removed by an ashing process.

Figure 3C:
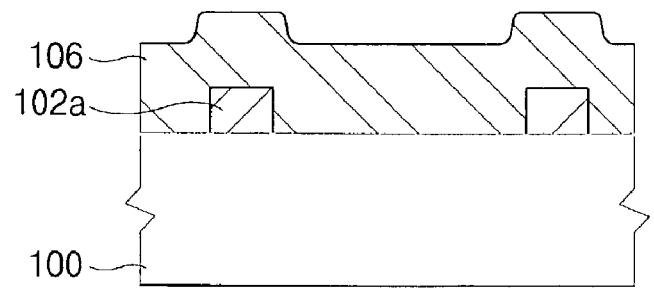

Referring to FIG. 3C, a second insulation film 106 may be formed on the semiconductor wafer 100 such that the second insulation film 106 covers the first insulation film patterns 102a. Portions of the second insulation film 106 may protrude as compared to portions of the second insulation film 106 formed on semiconductor wafer 100, as shown in FIG. 3C. The insulation film 106 can include a silicon oxide film, a silicon nitride film or a composite film of the silicon oxide film and a silicon nitride film, for example. The second insulation film 106 may include material having high etching selectivity, relative to the first insulation film patterns 102a. For example, the second insulation film 106 may include the silicon oxide film while the first insulation film patterns 102a include silicon nitride. When the second insulation film 106 includes a material having a high etching selectivity, relative to the first insulation film patterns 102a, an upper face of the second insulation film 106 can be planarized.

Figure 3D:
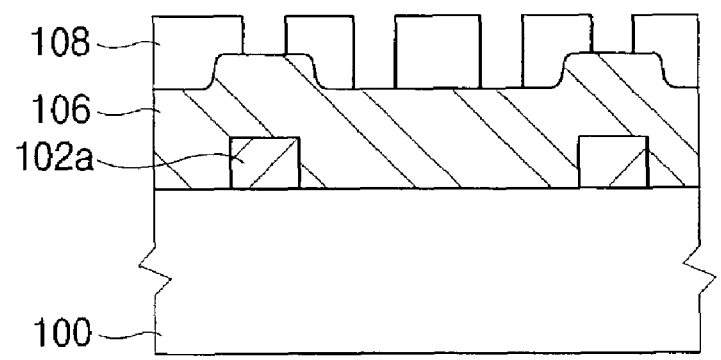

Referring to FIG. 3D, after a photoresist film applied to cover the surface of the second insulation film 106, the photoresist film may be patterned so that a second photoresist pattern 108 is formed, in order to form contact holes that are to be inspected by the surface analysis system. Some of the contact holes may expose upper portions of the semiconductor wafer 100, and other contact holes may expose the first insulation film patterns 102a. The second photoresist pattern 108 may include opened portions having regular widths over the first insulation film patterns 102a, and over portions of the semiconductor wafer 100 between the first insulation film patterns 102a, as shown in FIG. 3D.

Figure 3E:
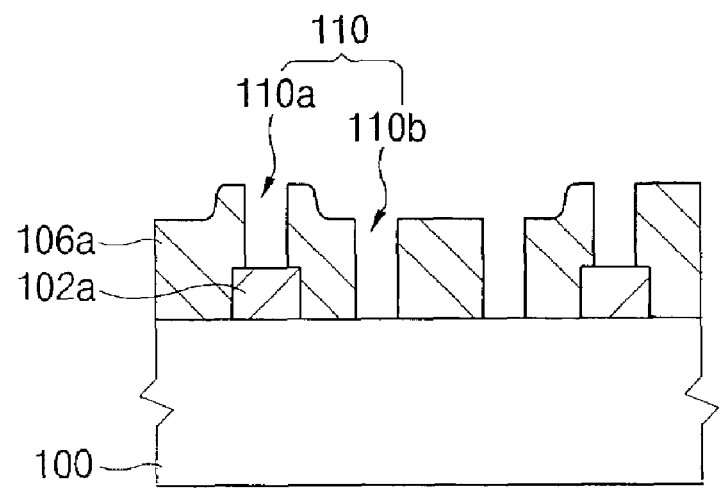

Referring to FIG. 3E, contact holes 110 may be formed through the second insulation film 106 by etching the second insulation film 106, e.g., by using the second photoresist pattern 108 as an etching mask, for example. The second insulation film 106 may be partially etched until upper portions of the semiconductor wafer 100 between the first insulation film patterns 102a are exposed. The first insulation film patterns 102a may also be exposed, through contact holes 110a. Further, some contact holes 110a (that expose the first insulation film patterns 102a) correspond to non-opened contact holes 110, while other contact holes 110b (exposing the upper portions of the semiconductor wafer 100) correspond to opened contact holes 110, as illustrated in FIG. 3E. Accordingly, the method in accordance with the above exemplary embodiment may be used to form a standard semiconductor wafer, usable in a surface analysis system, that may be used to determine the location of non-opened contact holes and/or the opened contact holes with electron beams.

In the exemplary embodiments, the standard semiconductor wafer can include the insulation film, exposed through the non-opened contact holes, having different thickness in different regions thereof, because portions of the first insulation film can have different thicknesses in different regions of the semiconductor wafer. That is, after the first insulation film is formed so as to have varied thickness in different regions on the semiconductor wafer, the first insulation patterns may also be formed to have different thicknesses in different regions of the semiconductor wafer, by patterning the first insulation film.

In addition, several semiconductor wafers can be provided using the above-described processes, where each semiconductor wafer can have a first insulation film at a thickness that differs from thicknesses of first insulation films in other semiconductor wafers.

According to exemplary embodiments described above, the opened contact holes and the non-opened contact holes may be formed together on the semiconductor wafer. Generally, the surface analysis system distinguishes the non-opened contact holes from the emitted intensity of secondary electrons caused by the electron beams generated from a scanning electron microscope (SEM). Thus, images between the opened contact holes and the non-opened contact holes can be more accurately identified with the surface analysis system. As a result, an inspector may discriminate the reliability of the data provided from the surface analysis system using the standard semiconductor wafer, with greater precision.

FIGS. 4A to 4G are cross-sectional views illustrating a method for manufacturing a standard semiconductor wafer used for a surface analysis system according to another exemplary of the present invention.

Figure 4A:
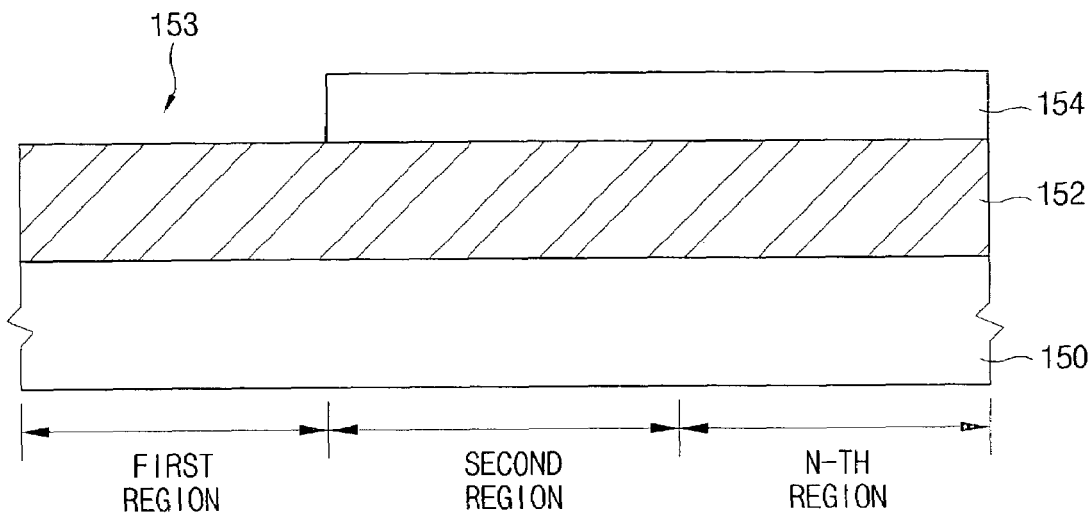
FIGS. 4A to 4G are cross-sectional views illustrating a method for manufacturing a standard semiconductor wafer used for a surface analysis system according to another exemplary embodiment of the present invention.

Referring to FIG. 4A, after a semiconductor wafer 150 is divided into a first region, a second region, . . . , to an n-th region, a first insulation film 152 may be formed on the semiconductor wafer 150 so as to cover the first through n-th regions. A photoresist film may then be applied on the first insulation film 152. The photoresist film may be selectively and partially exposed to form a first photoresist pattern 154 on the semiconductor wafer 150. The first photoresist pattern 154 may include an opened portion 153 exposing the first insulation film 152 in the first region of the semiconductor wafer 150.

Figure 4B:
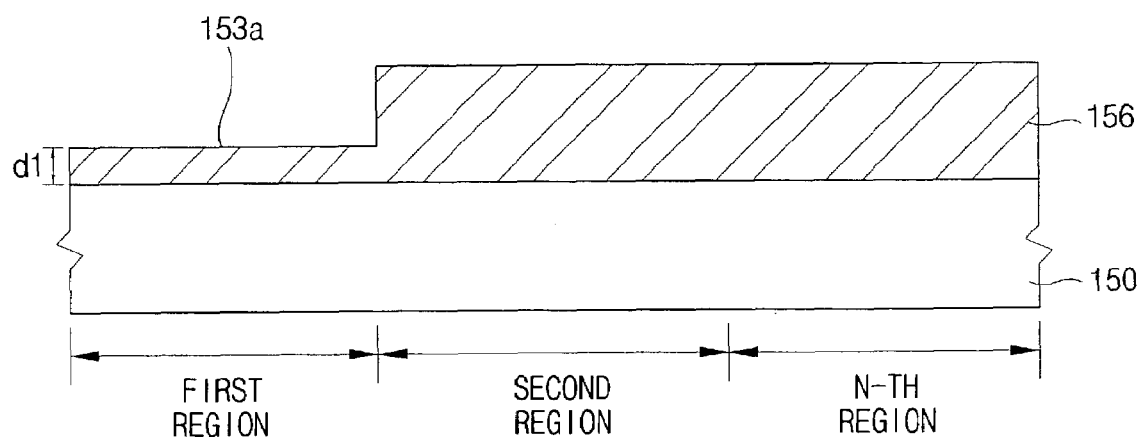

Referring to FIG. 4B, the opened portion 153 of the first insulation film 152 formed in the first region may be etched, such as by using the first photoresist pattern 154 as an etching mask, for example, so that the portion 153 of the first insulation film 152 in the first region has a first thickness d1, thereby forming a second insulation film 156 on the semiconductor wafer 150. The second insulation film 156 may include a stepped portion 153a, as illustrated in FIG. 4B. Subsequently, the first photoresist pattern 154 may be removed by an ashing process.

Figure 4C:
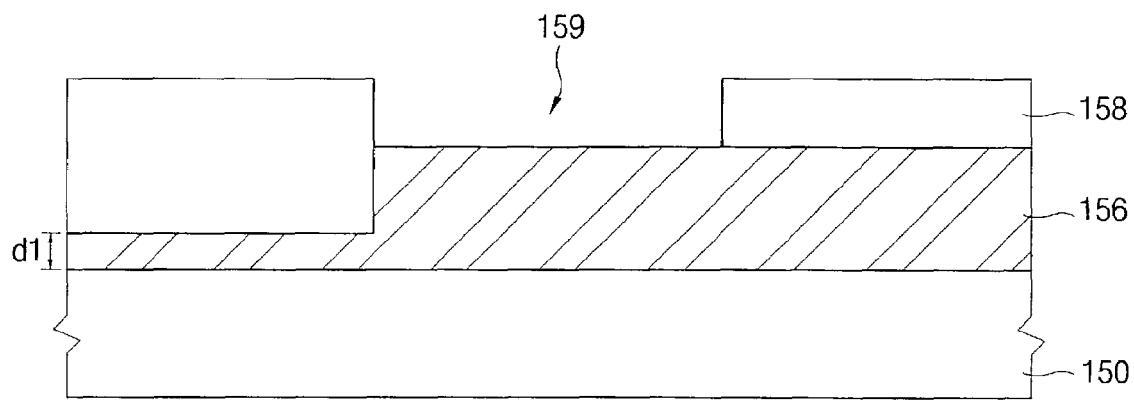

Referring to FIG. 4C, a photoresist film may be coated on the semiconductor wafer 150 and second insulation film 156 formed thereon. A portion 159 of the photoresist film disposed in the second region may be selectively exposed to form a second photoresist pattern 158 on the second insulation film 156.

Figure 4D:
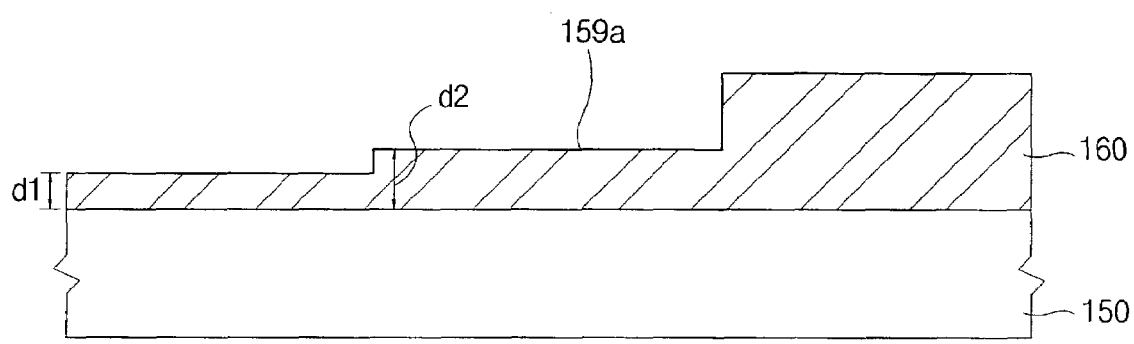

Referring to FIG. 4D, the second insulation film 156 may be partially etched using the second photoresist pattern 158 as an etching mask, such that the portion 159 of the second insulation film 156 remaining in the second region has a second thickness d2, thereby forming a third insulation film 160 on the semiconductor wafer 150. The third insulation film 10 may also include a stepped portion 159a at second thickness d2. The second photoresist pattern 158 may then be removed by an ashing process.

Figure 4E:
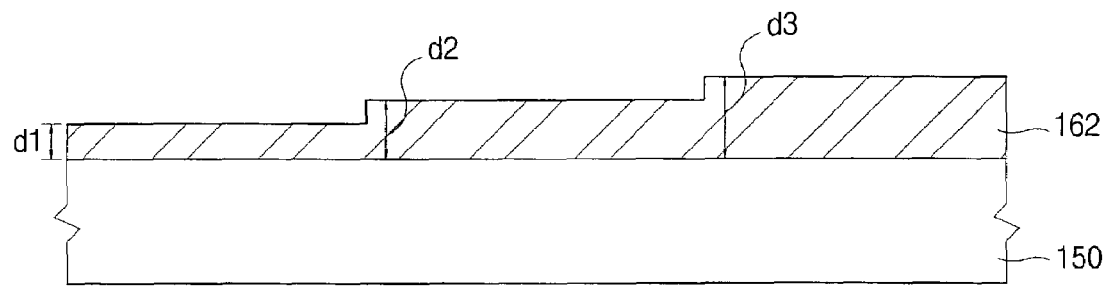

Referring to FIG. 4E, the processes of forming photoresist patterns and etching the insulation film may be repeatedly performed on the semiconductor wafer 150 with third insulation film 160 formed thereon. Therefore, an n-th insulation film 162 may be formed on the semiconductor wafer 150. The n-th insulation film (the desired insulation film) 162 has first to n-th thickness in the first to n-th regions of the semiconductor wafer 150, for example. Namely, the n-th insulation layer 162 has different thickness in different regions, as shown in FIG. 4E.

Figure 4F:
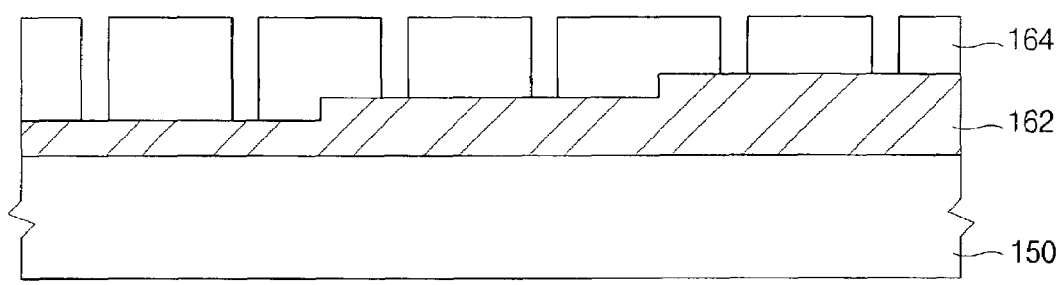

Referring to FIG. 4F, a photoresist film may be coated on the n-th insulation film 162. The photoresist film may be patterned such that a photoresist pattern 164 is formed in order to form contact holes in each region of the semiconductor wafer 150. Each of these contact holes may be inspected by the aforementioned surface analysis system, for example.

Figure 4G:
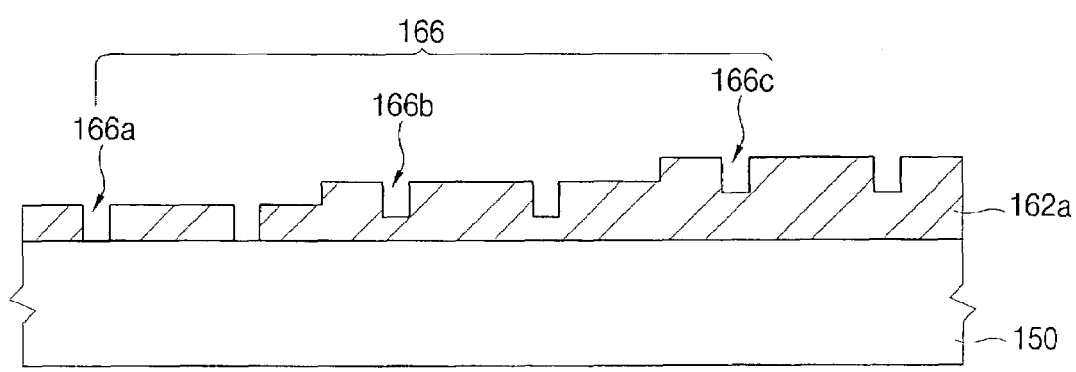

Referring to FIG. 4G, contact holes 166 may be formed by etching the n-th insulation film 162a using the photoresist pattern 164 as an etching mask. In this case, the n-th insulation film 162a may be etched to expose a portion of the semiconductor wafer 150 where the thinnest portion of the n-th insulation film 162a is positioned, as shown in FIG. 4G.

Some contact holes 166a formed through the thinnest portion of the n-th insulation film 162a may be opened contact holes. Otherwise, other contact holes 166b and 166c correspond to the non-opened contact holes, because the n-th insulation film 162a remains in contact holes 166b and 166c. The n-th insulation film 162a may thus have different thickness in the first to n-th regions of the semiconductor wafer 150. Therefore, a standard semiconductor wafer, used for the surface analysis system, may be formed which enables the surface analysis system to discriminate non-opened from opened contact holes using electron beams, as described above.

Figure 5A:
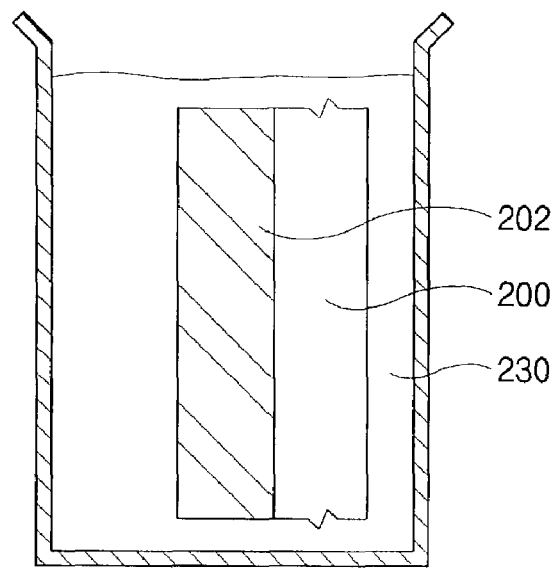
FIGS. 5A to 5D are cross-sectional views illustrating a method for manufacturing a standard semiconductor wafer used for a surface analysis system according to another exemplary embodiment of the present invention.
Figure 5B:
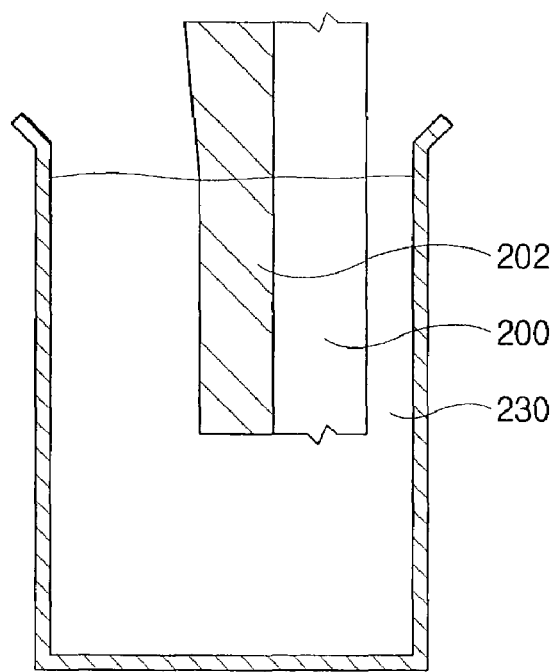

FIGS. 5A to 5D are cross-sectional views illustrating a method for manufacturing a standard semiconductor wafer used for a surface analysis system according to another exemplary embodiment of the present invention. Referring to FIG. 5A, after an insulation film 202 of uniform (or of substantially uniform) thickness is formed on a semiconductor wafer 200, the semiconductor wafer 200 may be immersed into a container including an etching solution 230 for etching the insulation film 202. Referring to FIG. 5B, the semiconductor wafer 200 may be removed from the etching solution 230, while the immersion time of the semiconductor wafer 200, relative to the etching solution 230, may be varied based on the regions of the semiconductor wafer 200, thereby forming an insulation film 204. In other words, the immersion time is a function of the speed at which the semiconductor wafer 200 may be removed from the etching solution 230, as well as what regions of the semiconductor wafer 200 are being removed.

Figure 6A:
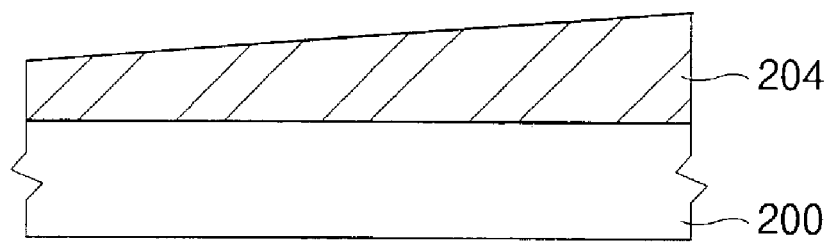
FIGS. 6A and 6B are cross-sectional views showing shapes of insulation films formed on semiconductor wafers according to the exemplary embodiment described with respect to FIGS. 5A to 5D.
Figure 6B:
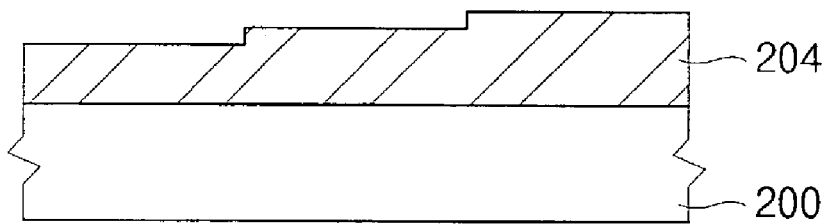

FIGS. 6A and 6B are cross-sectional views showing shapes of insulation films formed on semiconductor wafers according to the exemplary embodiment described with respect to FIGS. 5A and 5B. For example, the semiconductor wafer 200 and insulation film 202 may be vertically immersed into the etching solution 230. The immersed semiconductor wafer 200 may then be lifted from the etching solution 230 in the vertical direction. Because the semiconductor wafer 200 may be removed in a continuous, slow manner from the etching solution 230, the insulation film 204 formed on the semiconductor wafer 200 can have a smooth slope, as shown in FIG. 6A. Additionally, when the semiconductor wafer 200 is slowly lifted from the etching solution 230, thus varying the immersion time of each region of semiconductor wafer 200, the insulation film 204 may have a stepped upper face, as shown in FIG. 6B. Thus, an insulation film can have different thicknesses in different regions of the semiconductor wafer 200, as shown in FIGS. 6A and 6B, for example.

Figure 5C:
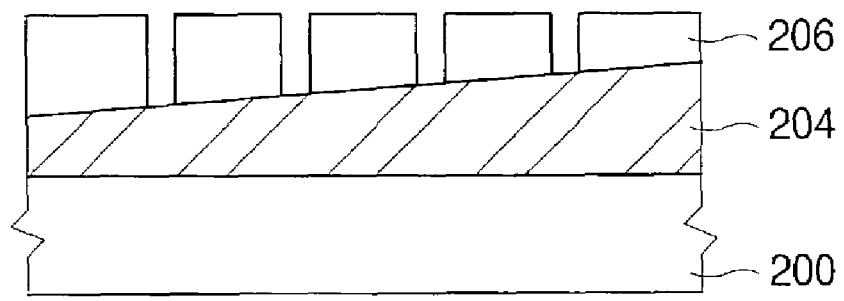

Hereinafter, a method for manufacturing a standard semiconductor wafer is described so that an insulation film of the wafer has a slope. Referring to FIG. 5C, a photoresist film may be coated on an insulation film 204 having different thicknesses in different regions of the semiconductor wafer 200, and then patterned so that a photoresist pattern 206 may be formed on the insulation film 204. This is done so as to form the contact holes that may be inspected by the surface analysis system, as discussed above.

Figure 5D:
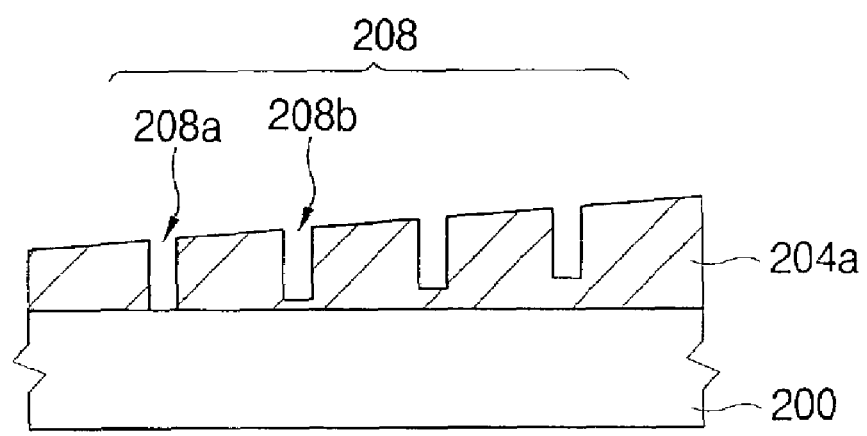

Referring to FIG. 5D, the insulation film 204a may be etched using the photoresist pattern 206 as an etching mask, for example, until portions of the semiconductor wafer 200 are exposed near, or in the vicinity of, where the relatively thinner portions of the insulation film 204a are positioned, thereby forming contact holes 208. Thus, some contact holes 208 formed through relatively thinner portions of the insulation film 204a may correspond to opened contact holes 208a exposing portions of the semiconductor wafer 200. On the other hand, other contact holes 208 formed through other portions of the insulation film 204a may become the non-opened contact holes 208b, e.g., where the insulation film 204a remains. Namely, the opened contact holes 208a and non-opened contact holes 208b may be formed together through the insulation film 204a. Also, portions of the insulation film 204a exposed through the non-opened contact holes 208b may have different thicknesses in different regions of the semiconductor wafer 200, as shown in FIG. 5D.

Figure 7A:
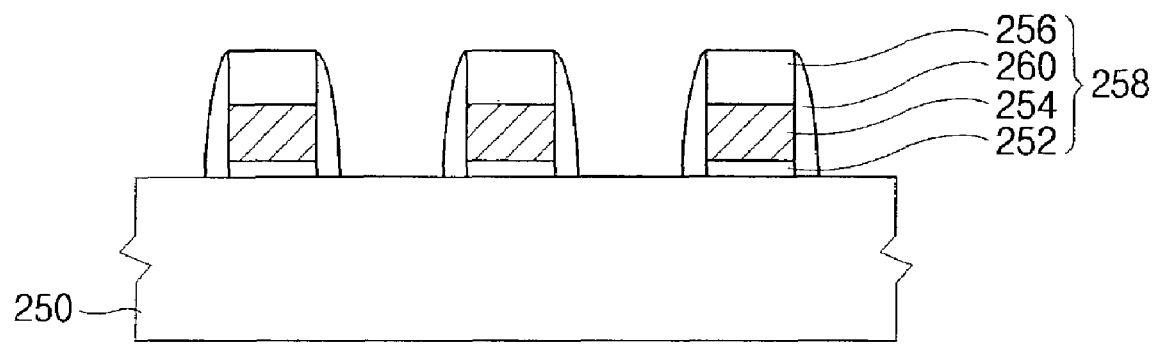
FIGS. 7A to 7D are cross-sectional views illustrating a method for manufacturing a standard semiconductor wafer used for a surface analysis system according to another exemplary embodiment of the present invention.

FIGS. 7A to 7D are cross-sectional views illustrating a method for manufacturing a standard semiconductor wafer used for a surface analysis system according to another exemplary of the present invention. Referring to FIG. 7A, gate structures 258, including nitride spacers 260 which form sidewalls thereof, may be formed on a semiconductor substrate 250 through a general semiconductor manufacturing process. For example, after a gate oxide film, polysilicon film and metal silicide film are successively formed on the semiconductor substrate 250, a nitride film may be formed on the metal silicide film. A photoresist pattern (not shown) may be formed on the nitride film in order to define gate electrodes, and then portions of the nitride film, metal silicide film, polysilicon film and gate oxide film may be successively etched by using the photoresist pattern as an etching mask, for example. Completed gate structures 258 are formed, including gate oxide patterns 252, polysilicon patterns 254, and metal silicide and nitride patterns 256, when the photoresist pattern is removed. Subsequently, the nitride spacers 260 are formed as the sidewalls of the gate structures 258.

Figure 7B:
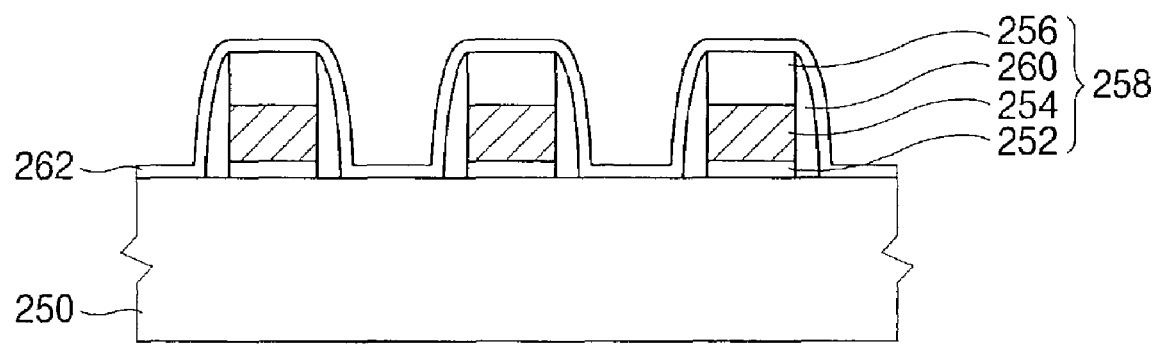

Referring to FIG. 7B, an etching stop layer 262 having a uniform or substantially uniform thickness may be formed on the semiconductor substrate 250, gate structures 258 and nitride spacers 260. The etching stop layer 262 may include a material having high etching selectivity, relative to the silicon oxide, such as silicon nitride, for example.

Figure 7C:
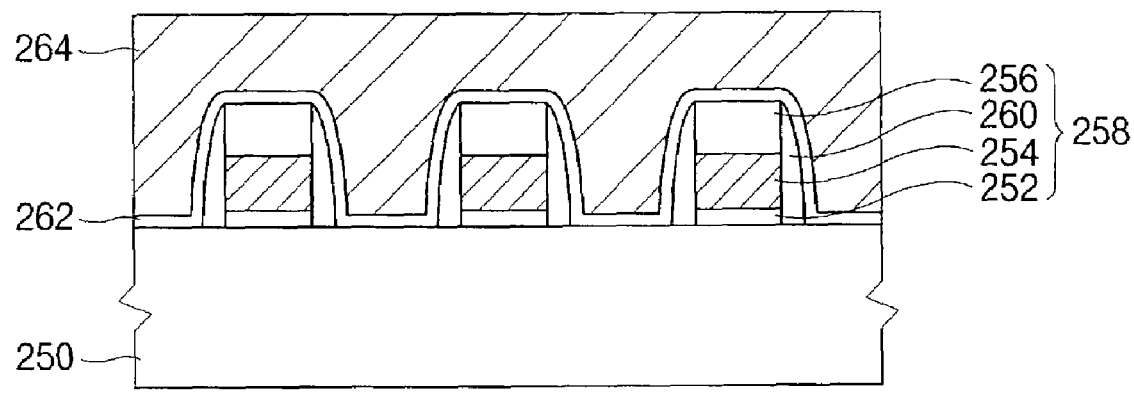

Referring to FIG. 7C, an interlayer dielectric film 264 may be formed on the etching stop layer 262 to cover the gate structures 258. The interlayer dielectric film 264 may then be polished to have an even upper face. The interlayer dielectric film 264 may include silicon oxide, for example.

Figure 7D:
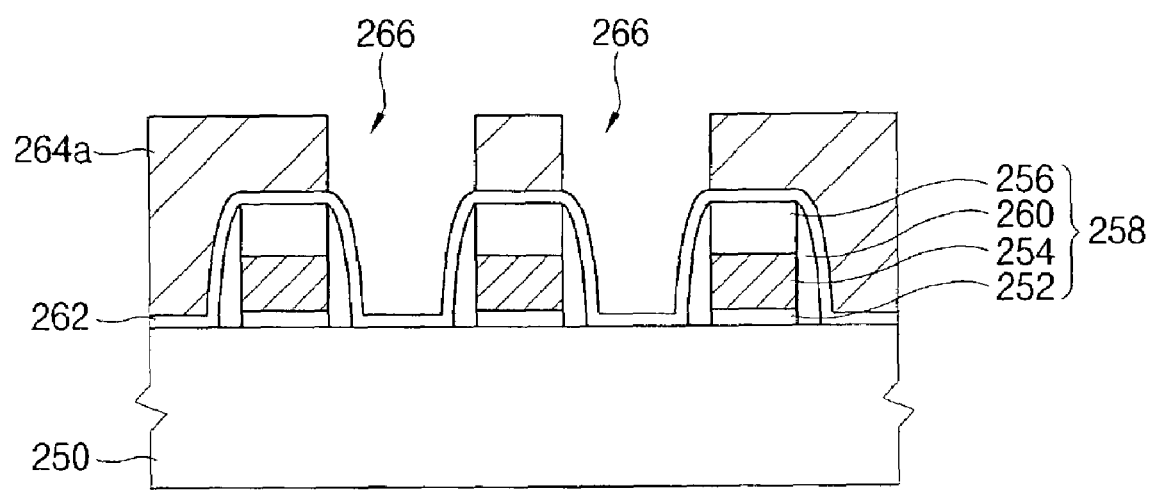

Referring to FIG. 7D, a photoresist pattern (not shown) may be coated on interlayer dielectric film 264a in order to form contact holes for inspection between the gate structures 258. The interlayer dielectric film 264a may then be etched until portions of the etching stop layer 262 on the semiconductor substrate 250 are exposed between the gate electrodes 258, using the photoresist pattern as an etching mask, for example. Self-aligned contact holes 266 may be formed through the interlayer dielectric film 264a; these holes 266 may be inspected by the aforementioned surface analysis system. Because the etching stop layer 262 remains within the self-aligned contact holes 266, the self-aligned contact holes 266 may correspond to non-opened contact holes. Additionally, the thickness of the etching stop layer 262 is not varied (e.g., the layer is a constant thickness) during the formation of the self-aligned contact holes 266.

Thus, the method in accordance with the above exemplary embodiment may be used to produce a standard semiconductor wafer, usable in a surface analysis system, to distinguish or discriminate non-opened contact holes from opened contact holes, as described in the previous exemplary embodiments. If several standard semiconductor wafers are formed, the standard semiconductor wafers may have etching stop layers 262 of different thickness. Thus, the thickness of the etching stop layers within in the self-aligned contact holes can be split or divided between the several standard semiconductor wafers.

Figure 8A:
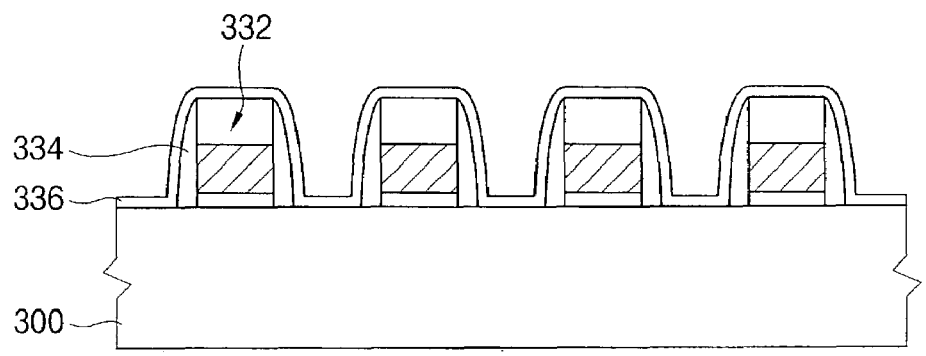
FIGS. 8A to 8C are cross-sectional view illustrating a method for manufacturing a standard semiconductor wafer used for a surface analysis system according to another exemplary embodiment of the present invention.
Figure 8B:
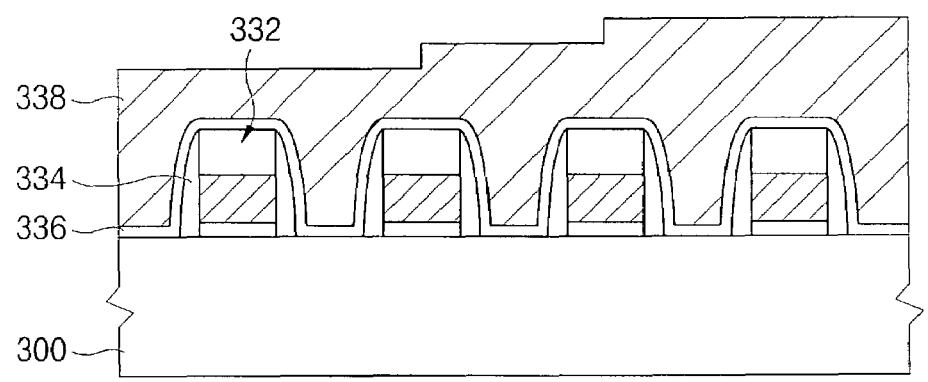
Figure 8C:
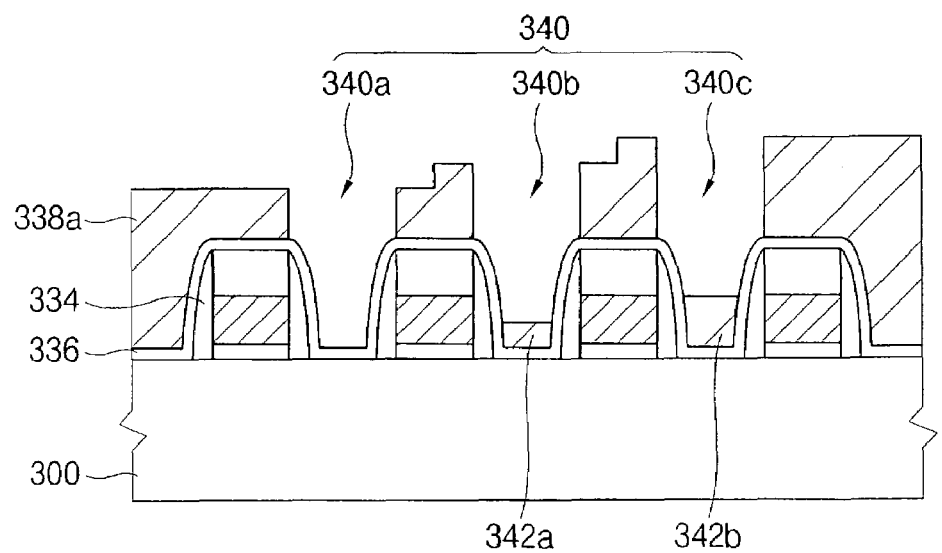

FIGS. 8A to 8C are cross-sectional views illustrating a method for manufacturing a standard semiconductor wafer used for a surface analysis system according to another exemplary embodiment of the present invention. The present exemplary embodiment is substantially identical to that described in the previous exemplary embodiment, except that in this exemplary embodiment the interlayer dielectric film may have different thicknesses in different regions of the semiconductor substrate.

Referring to FIG. 8A, gate structures 332, including nitride spacers 334 forming the sidewalls thereof, may be formed on a semiconductor substrate 300 by a general semiconductor manufacturing process. An etching stop layer 336 having a uniform or substantially uniform thickness may then be formed on the semiconductor substrate 300, gate structures 332 and nitride spacers 334. However, it is not necessary to form the etching stop layer 336 in the present exemplary embodiment.

Referring to FIG. 8B, an interlayer dielectric film 338 may be formed on the etching stop layer 336 to cover gate structures 332. In the same manner as described above with respect to FIGS. 4A to 4G, and after an upper face is formed on the interlayer dielectric film 338, the interlayer dielectric film 338 may be dry etched, for example, in order to have different thicknesses in different regions of the semiconductor substrate 300. Alternatively, and as previously described with respect to FIGS. 5A to 5D, the interlayer dielectric film 338 may be wet etched to have different thicknesses in different regions of the semiconductor substrate 300 (e.g., after an even upper face has been formed on the interlayer dielectric film 338).

Referring to FIG. 8C, a photoresist pattern (not shown) may be coated on interlayer dielectric film 338a in order to form contact holes (e.g., for inspection) between the gate structures 332. The interlayer dielectric film 338a may then be etched using the photoresist pattern as an etching mask, for example, so that self-aligned contact holes 340 are formed through the interlayer dielectric film 338a. FIG. 8C therefore illustrates one exemplary standard semiconductor wafer used in the surface analysis system to determine or discriminate the non-opened contact holes and opened contact holes by using electron beams.

In the standard semiconductor wafer of the present exemplary embodiment, portions of the interlayer dielectric film 342a and 342b within self-aligned contact holes 340a, 340a and 340c may have differing thicknesses in different regions of the semiconductor substrate 300, as shown in FIG. 8C. Therefore, the cost for maintaining the standard semiconductor wafer may be reduced, without requiring a standard semiconductor wafer where a thickness of the etching stop layer is required to be split between several semiconductor wafers.

Therefore, the exemplary embodiments of the present invention provide a standard semiconductor wafer usable in a surface analysis system that employs electron means to discriminate opened contact holes and non-opened contact holes, for example. Reliability of data obtained from the surface analysis system may be more precisely discriminated by identifying whether or not the data captures a real failure to some degree, and/or whether identical data can be obtained from the surface analysis system when the surface analysis system repeatedly inspects the same object.

Although exemplary embodiments of the present invention have been described, it is understood that the present invention should not be limited to these exemplary embodiments, as various changes and modifications may be made by one skilled in the art within the spirit and scope of the present invention as defined by the appended claims.

What is claimed is:

1. A method for forming a standard semiconductor wafer used in a surface analysis system, comprising:
   forming openings by partially etching a semiconductor substrate;
   forming an insulation film on the semiconductor substrate to fill the openings; and
   forming contact holes, to be inspected by the surface analysis system, by etching the insulation film, the contact holes exposing portions of the semiconductor substrate and portions of the insulation film filled within the openings; wherein at least one contact hole exposes only the insulation film filled within one of said openings.

2. The method of claim 1, wherein
   said forming openings further includes forming a plurality of semiconductor substrates, and
   depths of the openings in each of the semiconductor substrates are different from each other.

3. The method of claim 1, wherein depths of the openings vary across the semiconductor substrate.

4. The method of claim 3, wherein said forming openings further comprises:
   defining first to n-th (wherein n denotes a positive integer) regions in the semiconductor substrate;
   etching a portion of the semiconductor substrate in the first region to a first depth by using a first etching mask pattern that selectively exposes a portion of the semiconductor substrate in the first region; and
   etching a portion of the semiconductor substrate in the n-th region to an n-th depth by using an n-th etching mask pattern that selectively exposes a portion of the semiconductor substrate in the n-th region.

5. The method of claim 1, wherein the semiconductor substrate includes a plurality of regions with depths of the openings being different in each region.

6. The method of claim 1, further comprising maintaining an interval between the openings so that at least one additional opening having a width substantially equal to the openings is disposed within the interval.

7. The method claim 1, wherein the insulation film is composed of at least one of a silicon oxide film, a silicon nitride film and a composite film of silicon oxide and silicon nitride.

8. The method of claim 1, wherein the insulation film has an substantially planar upper face.

9. The method of claim 1, wherein said forming an insulation film further comprises:
   forming a first insulation film to cover the openings;
   polishing the first insulation film so that a portion of the first insulation film within the openings remain in the openings, and so that a portion of the insulation film on a surface of the semiconductor substrate is removed to expose the semiconductor substrate; and
   forming a second insulation film on the first insulation film and semiconductor substrate.

10. The method of claim 1, wherein said forming an insulation film further comprises:
    forming a first insulation film to cover the openings; and polishing the first insulation film so that a portion of the first insulation film remains in the openings, while a surface of the semiconductor substrate is covered with another portion of the insulation film.

11. A standard semiconductor wafer used in a surface analysis system, comprising:
a semiconductor substrate including a plurality of openings in the semiconductor substrate; and
an insulation film provided on the semiconductor substrate to fill the openings, wherein a plurality of contact holes, to be inspected by the surface analysis system, are provided in the insulation film, the contact holes exposing portions of the semiconductor substrate and portions of the insulation film within the openings; wherein at least one contact hole exposes only the insulation film filled within one of said openings.

12. A standard semiconductor wafer used in a surface analysis system that is formed by the method of claim 1.

13. A method for forming a standard semiconductor wafer used in a surface analysis system, comprising:
forming one or more first insulation film patterns on a semiconductor substrate;
forming a second insulation film on the first insulation film patterns and the semiconductor substrate; and
forming contact holes, to be inspected by the surface analysis system, by partially etching the second insulation film, the contact holes exposing portions of the semiconductor substrate and portions of the first insulation film patterns.

14. The method of claim 13, wherein
said forming first insulation film patterns further includes forming first insulation film patterns on a plurality of semiconductor substrates, and
thicknesses of the first insulation film patterns in each of the semiconductor substrates are different from each other.

15. The method of claim 13, wherein thicknesses of the first insulation film patterns vary across the semiconductor substrate.

16. The method of claim 13, further comprising maintaining an interval between each of the first insulation film patterns so that widths of each of the first insulation film patterns are substantially equal.

17. The method of claim 13, wherein the first insulation film patterns include at least one of a silicon oxide film pattern, a silicon nitride film pattern and a composite film pattern of silicon oxide and silicon nitride.

18. The method of claim 13, wherein the second insulation film includes at least one of a silicon oxide film, a silicon nitride film and a composite film of silicon oxide and silicon nitride.

19. A method for forming a standard semiconductor wafer used for a surface analysis system, comprising:
dividing a semiconductor substrate into first to n-th (wherein n denotes a positive integer) regions;
forming an insulation film on the semiconductor substrate, the insulation film including portions having different thicknesses in different regions of the semiconductor substrate; and
forming contact holes, to be inspected by the surface analysis system, by partially etching the insulation film in each region of the semiconductor substrate, the contact holes exposing portions of the semiconductor substrate and the insulation film.

20. The method of claim 19, wherein the insulation film includes at least one of a silicon oxide film, a silicon nitride film and a composite film of silicon oxide and silicon nitride.

21. The method of claim 19, wherein said forming an insulation film further comprises:
forming an insulation film with a substantially uniform thickness on the semiconductor substrate;
selectively etching an insulation film in the first region of the semiconductor substrate to form a first insulation film at a first thickness;
selectively etching the first insulation film formed in a second region of the semiconductor substrate to form a second insulation film at a second thickness; and
selectively etching an (n-1)th insulation film (wherein n denotes a positive integer) formed in an n-th region of the semiconductor substrate to form a (n-1)th insulation film at an n-th thickness.

22. The method of claim 19, wherein said forming an insulation film further comprises:
forming an insulation film having a substantially uniform thickness on the semiconductor substrate;
immersing the semiconductor substrate and insulation film into an etching solution for etching the insulation film; and
lifting the semiconductor substrate from the etching solution, wherein immersion time of the insulation film is varied across the first to n-th regions.

23. A method for forming a standard semiconductor wafer used in a surface analysis system, comprising:
forming first patterns on a semiconductor substrate;
forming spacers on sidewalls of the first patterns;
forming an interlayer dielectric film on the first patterns and spacers; and
forming contact holes, to be inspected by the surface analysis system, by partially etching the interlayer dielectric film between the first patterns, the contact holes including non-opened contact holes exposing portions of films beneath the non-opened contact holes.

24. The method of claim 23, further comprising:
forming an etching stop layer having a substantially uniform thickness on the first patterns and semiconductor substrate, said forming an etching stop layer performed after said forming spacers.

25. The method of claim 24, wherein
said forming an etching stop layer includes forming a plurality etching stop layers on a plurality of semiconductor substrates, and
thicknesses of the etching stop layers in each of the semiconductor substrates being different from each other.

26. The method of claim 23, wherein the interlayer dielectric film has an substantially planar upper face.

27. The method of claim 23, wherein said forming contact holes further includes forming contact holes by etching the interlayer dielectric film so that an etching stop layer is exposed through the contact holes.

28. The method of claim 23, wherein the interlayer dielectric includes stepped portions in each region of the semiconductor substrate.

29. The method of claim 23, wherein said forming an interlayer dielectric further comprises:
forming an insulation film having a substantially uniform thickness and a substantially planar upper face on the first patterns;
selectively etching the insulation film formed in a first region of the semiconductor substrate to form a first insulation film at a first thickness;
selectively etching the first insulation film formed in the second region of the semiconductor substrate to form a second insulation film at a second thickness; and selectively etching an (n-1)th insulation film (wherein n denotes a positive integer) formed in an n-th region of the semiconductor substrate to form an (n-1)th insulation film having a n-th thickness.

30. The method of claim 23, wherein said forming an interlayer dielectric further comprises:
   forming an insulation film having a substantially uniform thickness on the semiconductor substrate;
   immersing the semiconductor substrate and insulation film into an etching solution for etching the insulation film; and
   lifting the semiconductor substrate from the etching solution, wherein immersion time of the insulation film is varied across the first to n-th regions.

31. A method of forming a semiconductor wafer, comprising:
   partially etching a semiconductor substrate to form openings therein;
   forming an insulation film over the semiconductor substrate and openings; and
   forming contact holes that expose portions of the semiconductor substrate and portions of the insulation film within the openings; wherein at least one contact hole exposes only the insulation film filled within one of said openings.

32. The method of claim 31, wherein depths of the openings vary across the semiconductor substrate.

33. A semiconductor wafer, comprising:
   a semiconductor substrate including a plurality of openings in the semiconductor substrate; and
   an insulation film provided on the semiconductor substrate and openings, wherein the insulation film includes a plurality of contact holes exposing portions of the semiconductor substrate and portions of the insulation film within the openings; wherein at least one contact hole exposes only the insulation film filled within one of said openings.

34. A semiconductor wafer formed by the method of claim 31.

35. A method of forming a semiconductor wafer, comprising:
   forming gate structures having sidewalls on a semiconductor substrate;
   forming a dielectric film on the gate structures and sidewalls; forming contact holes having varied depths by partially etching and removing a portion of the dielectric film that forms the contact holes; and
   forming an etching stop layer having a substantially uniform thickness on the substrate and the gate structures.

36. The method of claim 35, wherein the contact holes expose at least one portion of the etching stop layer and at least one portion of the dielectric film within the contact holes.

37. The method of claim 35, wherein the contact holes expose at least one portion of the etching stop layer and at least two portions of the dielectric film within the contact holes, the at least two portions having varied depths.

* * * * *